(12) United States Patent
Koopman et al.

(10) Patent No.: US 10,890,540 B2
(45) Date of Patent: Jan. 12, 2021

(54) OBJECT IDENTIFICATION AND COMPARISON

(71) Applicant: ASML NETHERLANDS B.V., Veldhoven (NL)

(72) Inventors: Adrianus Cornelis Matheus Koopman, Hilversum (NL); Scott Anderson Middlebrooks, Duizel (NL); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/490,091

(22) PCT Filed: Mar. 2, 2018

(86) PCT No.: PCT/EP2018/055164
§ 371 (c)(1),
(2) Date: Aug. 30, 2019

(87) PCT Pub. No.: WO2018/172039
PCT Pub. Date: Sep. 27, 2018

(65) Prior Publication Data
US 2020/0072761 A1 Mar. 5, 2020

Related U.S. Application Data

(60) Provisional application No. 62/474,571, filed on Mar. 21, 2017.

(51) Int. Cl.
*G06F 30/398* (2020.01)
*G01N 21/956* (2006.01)
*G03F 7/20* (2006.01)

(52) U.S. Cl.
CPC .... *G01N 21/95607* (2013.01); *G03F 7/70625* (2013.01); *G03F 7/70741* (2013.01); *G06F 30/398* (2020.01)

(58) Field of Classification Search
CPC .......... G01N 21/95607; G06F 30/398; G03F 7/70625; G03F 7/70741
(Continued)

(56) References Cited

U.S. PATENT DOCUMENTS 5,969,441 A 10/1999 Loopstra et al.
2002/0186879 A1 12/2002 Hemar et al.
(Continued)

FOREIGN PATENT DOCUMENTS

CN 1983023 6/2007
CN 101236360 8/2008
(Continued)

OTHER PUBLICATIONS

International Search Report and Written Opinion issued in corresponding PCT Patent Application No. PCT/EP2018/055164, dated May 25, 2018.
(Continued)

*Primary Examiner* — Suresh Memula
(74) *Attorney, Agent, or Firm* — Pillsbury Winthrop Shaw Pittman LLP

(57) ABSTRACT

A method including selecting a shaped feature from a set of shaped features, each shaped feature of the set of shaped features having a set of points on a perimeter of the shape of the shaped feature, creating a plurality of shape context descriptors for the selected shaped feature, wherein each shape context descriptor provides an indication of a location in a shape context descriptor framework of a first focus point of the set of points in relation to a second point of the set of points, and identifying a shaped feature from the set of
(Continued)

shaped features having a same or similar shape as the selected shaped feature based on data from the plurality of shape context descriptors.

20 Claims, 9 Drawing Sheets

(58) Field of Classification Search
USPC .......................................................... 716/55
See application file for complete search history.

(56) References Cited

U.S. PATENT DOCUMENTS

| | | | | |
|---|---|---|---|---|
| 2007/0022329 | A1* | 1/2007 | Adamek | G06K 9/6204 |
| | | | | 714/701 |
| 2010/0058256 | A1* | 3/2010 | El-Zein | G06F 30/327 |
| | | | | 716/132 |
| 2010/0122225 | A1* | 5/2010 | Cao | G06F 30/00 |
| | | | | 716/136 |
| 2010/0242000 | A1* | 9/2010 | Strenski | G06F 30/39 |
| | | | | 716/136 |
| 2011/0107280 | A1* | 5/2011 | Liu | G03F 7/70666 |
| | | | | 716/53 |
| 2012/0124529 | A1* | 5/2012 | Feng | G02B 19/0095 |
| | | | | 716/54 |
| 2012/0133927 | A1 | 5/2012 | Hamamatsu et al. | |
| 2013/0114898 | A1* | 5/2013 | Taguchi | G01B 11/00 |
| | | | | 382/170 |
| 2015/0198798 | A1 | 7/2015 | Seitz et al. | |
| 2017/0046473 | A1 | 2/2017 | Fouquet et al. | |
| 2017/0363969 | A1 | 12/2017 | Hauptmann et al. | |

FOREIGN PATENT DOCUMENTS

| | | |
|---|---|---|
| CN | 103176372 | 6/2013 |
| JP | 2016194482 | 11/2016 |
| TW | 201621472 | 6/2016 |
| TW | I549012 | 9/2016 |
| TW | 201706590 | 2/2017 |

OTHER PUBLICATIONS

Taiwanese Office Action issued in corresponding Taiwanese Patent Application No. 107109407, dated Feb. 27, 2019.
Belongie, S., et al: "Shape Matching and Object Recognition Using Shape Contexts", IEEE Transactions on Pattern Analysis and Machine Intelligence, vol. 24, No. 4, Apr. 1, 2002, pp. 509-522.

* cited by examiner

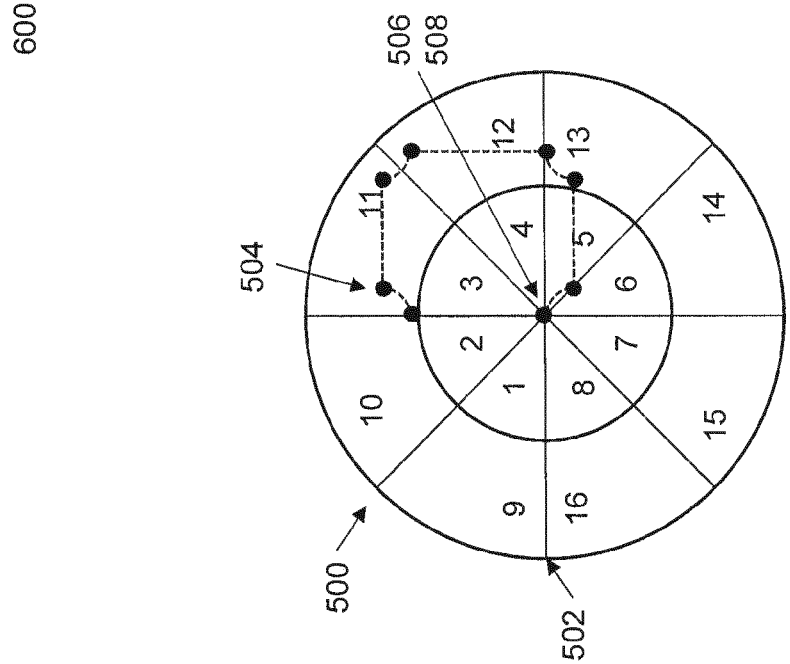

OBJECT IDENTIFICATION AND COMPARISON

CROSS-REFERENCE TO RELATED APPLICATIONS

This application is the U.S. national phase entry of PCT Patent Application No. PCT/EP2018/055164, filed Mar. 2, 2018, which claims the benefit of priority of U.S. patent application No. 62/474,571 which was filed on Mar. 21, 2017 and which is incorporated herein in its entirety by reference.

FIELD

The disclosure herein relates generally to image processing of objects, such as those used or produced by a manufacturing flow.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a pattern corresponding to an individual layer of the IC, and this pattern can be imaged onto a target portion (e.g. comprising part of, one or several dies) on a substrate (e.g. a silicon wafer) that has a layer of radiation-sensitive material (resist such as photoresist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc. While the term substrate encompasses an underlying base (e.g., silicon), it can also, where applicable, encompass one or more layers overlying the base. Thus, transferring a pattern into or onto the substrate can include transfer of the pattern onto one or more layers on the substrate.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Manufacturing of devices, such as semiconductor devices, using a patterning process includes transferring patterns to substrates in order to create elements of the devices. Efficient and effective transfer of patterns to substrates results in devices with reproducible performance characteristics.

To enable such manufacturing using a patterning process, a digital layout file of a patterning device (such as a GDS file, a GDSII file, an OASIS file, or another format for conveying information about device element layouts for pattern transfer) is typically created and then used to create or control a patterning device based on the data stored in the digital layout file. The pattern of the patterning device is then transferred to the substrate. An inspection is typically performed after creating a patterning device and/or after transferring a pattern of the patterning device to substrates. Inspection can include defect inspection and/or pattern quality inspection. Inspection can reveal defects or poor pattern quality, which can lead to patterning device repair, replacement, etc. and in remedial steps in the patterning process (e.g., control of the process, rework of substrate, preventing a substrate from being further processed, change in the patterning device pattern, etc.). Inspection can follow etching as part of the patterning process.

So, to enable design, control, modification, etc. of an aspect of a patterning process, it is desirable to be able to identify features (e.g., structures) of a pattern used in the patterning process in terms of shape, whether the pattern is in a digital layout file, embodied at a patterning device and/or transferred to a substrate. Further, it is desirable to be able to find the same or similar features in a pattern in terms of shape. The identification of features and/or discovering same or similar features can be done based on one or more images captured in an inspection, such as described above.

For example, identification of features created on a substrate by shape and/or discovering same or similar features created on a substrate by shape can assist in determining whether the features have an expected appearance consistent with a desired device structure or consistent with other similar features. Appropriate action can be taken if the expected appearance is consistent or not with the design intent (e.g., change the patterning process, alter a design of an aspect of the patterning process, identify and correct a process shift, etc.).

Similarly, identification of features in a digital layout file or patterning device by shape and/or discovering same or similar features in a digital layout file or patterning device can assist in determining whether the features have an expected appearance consistent with a design intent. Appropriate action can be taken if the expected appearance is consistent or not with the design intent (e.g., to determine whether the pattern on the patterning device can be modified to generate an improved pattern on the substrate before using the patterning device in a manufacturing process, to determine whether a patterning device should be replaced, repaired, etc. because of pattern degradation or contamination, etc.).

So, there are described herein various specific techniques to enable identification of features in terms of shape and/or discovering same or similar features by shape.

In an embodiment, there is provided a method comprising: selecting a shaped feature from a set of shaped features, each shaped feature of the set of shaped features having a set of points on a perimeter of the shape of the shaped feature; creating, by a hardware computer, a plurality of shape context descriptors for the selected shaped feature, wherein each shape context descriptor provides an indication of a location in a shape context descriptor framework of a first focus point of the set of points in relation to a second point of the set of points; and identifying, by the hardware computer, a shaped feature from the set of shaped features having a same or similar shape as the selected shaped feature based on data from the plurality of shape context descriptors.

In an embodiment, there is provided a computer program product comprising a computer readable medium having instructions recorded thereon, the instructions when executed by a computer implementing a method as described herein.

These and other features, as well as the methods of operation and functions of the related elements of structure and the combination of parts and economies of manufacture, will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention.

BRIEF DESCRIPTION OF THE DRAWINGS

Embodiments are illustrated by way of example, and not by way of limitation, in the figures of the accompanying drawing and in which like reference numerals refer to similar elements.

FIG. 5 depicts a construct used to generate a shape context descriptor for shape identification and/or comparison, according to an embodiment.

FIG. 6 depicts a shape context descriptor vector, according to an embodiment.

FIG. 7 depicts a shape context descriptor vector in the context of a multidimensional space, according to an embodiment.

DETAILED DESCRIPTION

Figure 1:
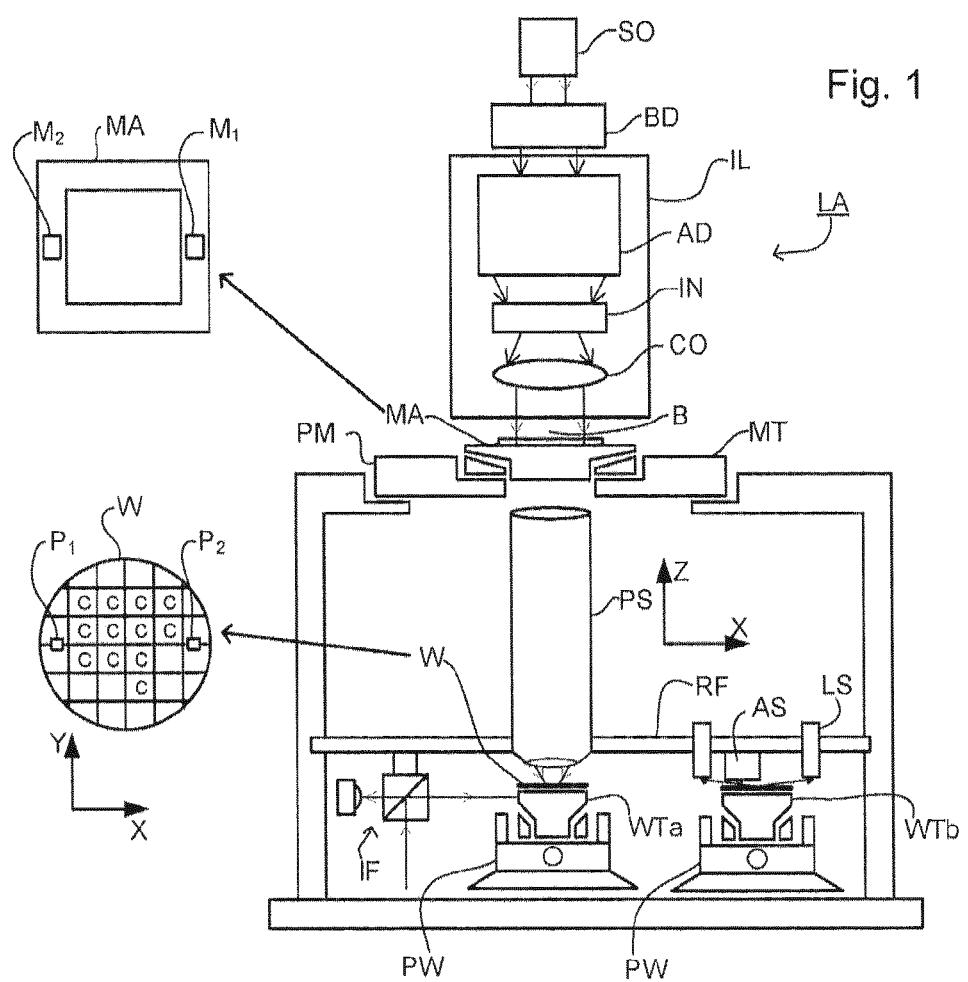
FIG. 1 depicts a schematic diagram of an embodiment of a lithographic apparatus.

FIG. 1 schematically depicts a lithographic apparatus LA in association with which the techniques described herein can be utilized. The apparatus includes an illumination optical system (illuminator) IL configured to condition a radiation beam B (e.g., ultraviolet (UV), deep ultraviolet (DUV) or extreme ultraviolet (EUV) radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a refractive, reflective, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. As another example the patterning device comprises a LCD matrix.

As here depicted, the apparatus is of a transmissive type (e.g., employing a transmissive patterning device). However, the apparatus may be of a reflective type (e.g., employing a programmable mirror array of a type as referred to above, or employing a reflective mask (e.g., for an EUV system)).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of embodiments.

Figure 2:
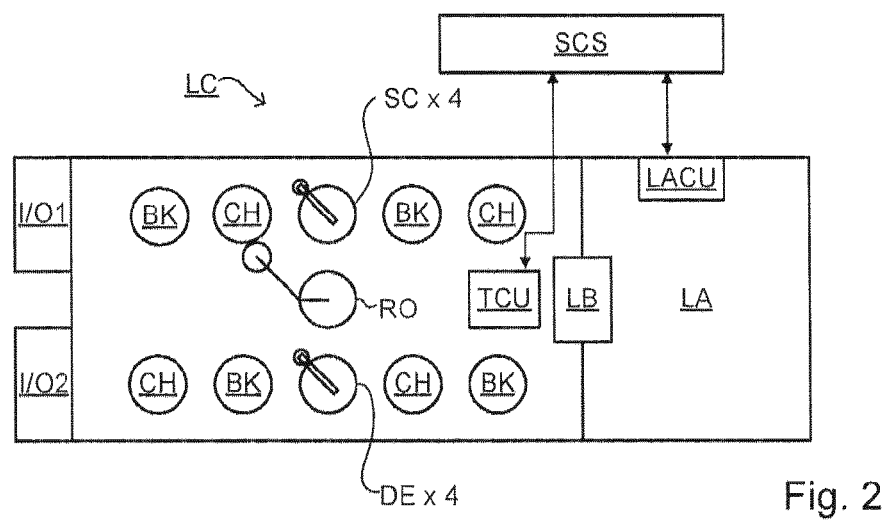
FIG. 2 depicts a schematic diagram of an embodiment of a lithographic cell.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A patterning device will embody or produce a pattern with numerous individual features that are used to generate a pattern on a substrate (such as substrate W). In an embodiment, the pattern as transferred to the substrate is used to create elements of a device after, for example, etching and/or deposition. Individual features of a pattern typically correspond to elements of, e.g., an integrated circuit: some features correspond to gate structures, some features correspond to contacts, etc. As will be appreciated each of those features (e.g., features of a patterning device pattern, features of a pattern as formed on a substrate, etc.) will typically have a shape.

As noted above, it can be useful to identify features with certain shapes in a pattern. This can be a pattern of, or for, a patterning device, can be a pattern as produced on a substrate using a patterning device, etc.

One method of identifying features with the same or similar shapes, such as shapes in one or more scanning electron microscope images of a substrate, is to directly overlay images in order to see if points on the shapes are at the same or similar locations. However, for example, when shapes in overlaid images are at different orientations, direct overlay of images fails to identify identical shapes. Similarly, identical shapes that are different sizes will not be identified as identical shapes using direct overlay when the shapes are different sizes unless one of the shapes is scaled or normalized with regard to the other shape. Further, direct overlay can be ill-suited for identifying shapes that are similar in shape, but not identical.

Moreover, the images can be used to evaluate, for example, transfer of a patterning device pattern to a substrate. But, the large numbers of shapes in a pattern for, e.g., a typical semiconductor device, can make finding features of interest for inspection difficult. Depending on the number of features, and the proximity of some features to each other, finding individual features of a certain shape, or combinations of features, in an image can be time-consuming. So, it would be desired to have an improved way of knowing a location of a particular shaped featured, or combinations of shaped features, so as to, e.g. decrease the time needed to find features with a same or similar shape. While an index of locations of features may be available, the index may not provide an effective means to know the shape of the feature or to find features with the same or similar shapes. So, an improved feature identification and/or comparison method is desired that enable identification of features with the same or similar shape. The results of such an improved feature identification and/or comparison method can be used for various purposes such as design, control, etc. of a patterning process, reducing the amount and/or time of inspections, etc.

So, in an embodiment, it is desired to have an improved method of feature identification and/or comparison. This improved method recognizes that the same or similar features have a generally same or similar outlines or perimeters, and generally similar locations of points along the perimeters. This can be whether the shapes have been rotated, scaled, translated, etc. In an embodiment, the points along shape perimeters can include vertices where edges of a shape perimeter intersect and points along edges away from vertices of the shape perimeters.

In an embodiment, shape identification involves analyzing or abstracting a shape of a feature into a descriptor that represents the perimeter or outline of the feature. In an embodiment, shape similarity identification, or shape comparison, involves operations of analyzing or abstracting shapes of a plurality of features using the descriptor to determine whether a reference or target shape of feature and a compared shape are similar or identical.

In an embodiment, there are provided techniques to identify the shape of a feature in an image, which will be referred to herein as shape identification. For example, while an image may depict the shape of a feature, the mere depiction of the image doesn't enable one to locate another instance of that shape in the image or to identify a similar shape. Thus, for example, identifying the shape of a feature can be enable location of the feature in any other part of the image or in another image entirely. Additionally or alternatively, identifying the shape can enable determining whether the shape of another feature is the same or similar as described further herein and thus enable location of such other feature. This will be referred to a shape searching In an embodiment, there are provided techniques to identify features that have the same or similar shape, which will be referred to herein as shape comparison. For example, using the identification of the shapes of a plurality of features, it can be determined whether one or more features of the plurality of features have the same or similar shape as one or more other features. This can be useful, for example, to group features in a pattern as being of the same or similar shape and which can be then be used for defect prediction analysis (since, e.g., the same or similar shape is expected to be processed similarly and thus relatively equally likely to be defective or not), used for expediting inspection (e.g., by aiding an inspection technique to inspect those locations having features of the same or similar shape if that shape is of interest or is likely to be defective), etc.

Thus, there are numerous applications of the results of these identification and/or comparison techniques. For example, given a set of measured images, features with a particular shape can be located in that data and measurement results from those feature locations can be used in patterning process analysis, such as process window analysis, for a particular feature shape. The particular features located could be ones with the specific particular shape determined through the shape identification process or could be ones that are the same or similar in shape as determined using the results of the shape comparison process. As another example, the set of measurement locations used in any patterning process analysis affects the quality and validity of the derived results (e.g., mathematical models). If only or too many non-critical or redundant aspects of the pattern are measured or used, then the results could be too optimistic (e.g. process windows that are too optimistic), leading to a potentially failing device. Similarly, measuring or using data from locations providing essentially the same information with respect to the process window can be wasteful and ineffective. But, measuring or using data from the complete pattern can often take too long to be practical. So, the results of the shape identification and/or shape comparison processes herein can guide the selection and/or measurement of data for patterning process analysis. As a further example, while a digital layout file provides information regarding the shapes of features of a pattern, it may not provide a mechanism to identify features having the same or similar shape nor provide a mechanism to locate a particular shape. For example, the digital layout file doesn't provide any identifier of the complete shape of a feature such that a particular shape can be located, let alone provide any information that identifies which features have similar shapes. Thus, it cannot distinguish which design features (e.g., clips) are similar or dissimilar. So, the results of the shape identification and/or shape comparison processes herein can be used as a means to search, segment, etc. the data in the digital layout file for particular same or similar shapes.

As a further example, measured (e.g., SEM) data can be hard to re-use for future unseen patterns since it may not be known whether the data is related (e.g., contains data regarding a particular shape or contains data regarding same or similar shapes as a particular shape). So, the shape identification and/or comparison processes herein can enable automatic determination of related data (e.g., SEM data). As a result, archive SEM data can be used to make predictions for future pattern layouts without necessarily having to measure the pattern layouts.

As another example, in an embodiment, using the shape identification process and/or shape comparison process, an underlying distribution of shape types can automatically be derived for an image. In an embodiment, shapes can then be ranked on how representative they are for the complete pattern design based on their design features. Given a limited number of measurement data (e.g., SEM measurement data), measurement locations (to measure or from which data should be used) can then be optimized to cover as much of the "shape space" as possible. Then given a set of these measurement locations, a representative process window, for example, can be derived.

In a further example, the features in a pattern can be labeled by type of shape using the results of the shape identification process and/or shape comparison process. This can allow, for example, determination of which shapes are often close to each other, which assist features are often close to which optical proximity corrected features, and/or which shapes are often printed above each other (e.g., for multi-patterning and/or for multiple physical layers). This information can then be used in patterning process design, control, etc.

In an embodiment, the shape identification process and/or shape comparison process can be used to organize an image. If distinct shape types are relevant in the context of a process window, it is useful to find where these are located throughout an image or a plurality of images (e.g., an archive of images). So, in an embodiment, the shape identification process and/or shape comparison process herein can be used to segment one or more images to extract shape objects. In the same manner, one can then build a search engine on these extracted shape objects. Thus, in an embodiment, there is provided a search engine to find and locate features with a particular shape and/or locate features with the same or similar shapes. A benefit of this approach is that it can deal with large data volumes (e.g., patterns can easily have millions or billions of shapes, and image data archives also can grow in these orders of magnitude) while still resulting in relatively fast query times.

Further, in an embodiment, features can be cross-identified between different sets of data. For example, a feature identified for a patterning device pattern layout (e.g., the digital layout file describing the patterning device pattern layout, a manufactured patterning device embodying the patterning device pattern layout, etc.) can be cross-identified with a same or similar feature in terms of shape created on a substrate using the patterning device pattern layout. As another example, a feature identified for a digital layout file for a patterning device can be cross-identified with a same or similar feature in terms of shape of a manufactured patterning device embodying the pattern described by the digital layout file. So, if, e.g., the shape "language" (e.g., the choice of shape context descriptor framework as described further herein, the choice of shapeme determination as described further herein, etc.) is the same or very similar, one can query across different types of pattern data. For example, a shape in a digital layout file can be identified given a SEM image shape, and vice versa. So, for example, a digital layout file and SEM image can be linked, not only based on coordinates, but also on content, namely same or similar shapes.

Also, in an embodiment, since for a patterned substrate (and optionally for particular applied processing steps) a set of metadata can be provided, the queries can be enriched with this information as well. So, for example, a possible query such as: "All G-type shapes, located on the edge of the substrate, that have W-type shapes on the layer above it" can be made.

With that context, embodiments of an improved shape identification process and/or shape comparison process are described in further detail hereafter.

Now, it should be noted that the description herein will focus on identifying the shape of a feature in an image. For example, the image can be of a substrate, of a patterning device, etc. The image can be of different types. An example image can be a scanning electron microscope image. Depending on the type of image, the image data may need to be processed to extract the features (objects) from the image using an applicable image processing technique.

But, the techniques herein can be applied to other data regarding a feature that has information regarding the shape of the feature. As an example, a digital layout file can have information regarding the shape of a pattern feature and so the techniques herein can be applied to that data as well. In embodiment, to do so, the digital layout file may be transformed to polygons in an x-y coordinate system.

Further, while the features herein are described in the context of device patterns (whether for use by or embodied in a patterning device, whether as produced on a substrate by a patterning device, etc.), the features can as any shaped object in an image or represented in information describing the shape of the object.

Shape Context Descriptors

In an embodiment, shape identification includes using a shape context descriptor framework (SCDF) to segment a shape in order to generate a shape context descriptor. In an embodiment, a shape context descriptor corresponds to the location of a point on the perimeter of the shape that falls within a segment of the shape context descriptor framework. Thus, in an embodiment, each shape context descriptor describes, for a particular point, in what segment the point falls. A count of the number of points falling into each segment of the shape context descriptor framework (SCDF) can be made and the collection of the counts for all the segments can give a representation of the shape.

Figure 3:
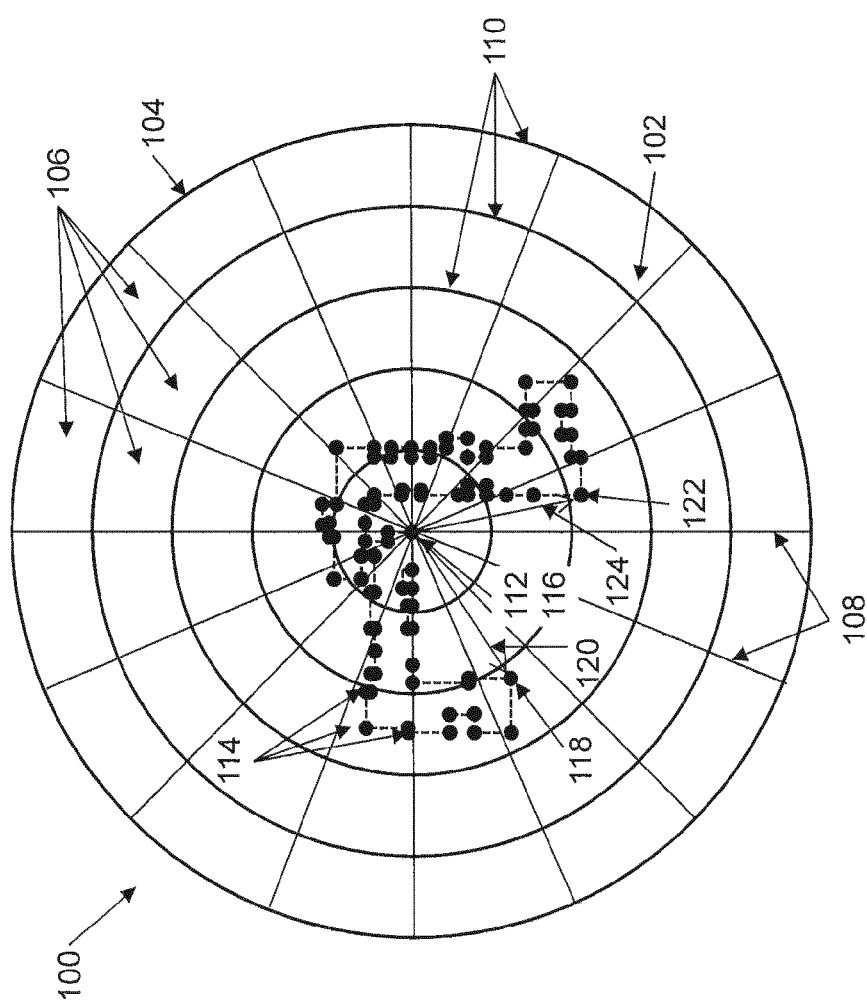
FIG. 3 depicts a construct used to generate a shape context descriptor for shape identification and/or comparison, according to an embodiment.

FIG. 3 depicts a construct 100 used to generate a shape context descriptor (SCD) for a shape, according to an embodiment. Construct 100 includes a shape context descriptor framework 104. In an embodiment, the shape context descriptor framework 104 comprises a plurality of segments 106. In this embodiment, the segments 106 are defined by radial dividers 108 and annular dividers 110. In this case, the shape context descriptor framework 104 is a polar coordinate grid having 80 segments, separated by sixteen (16) radial segments dividers 108 and five (5) annular segment dividers 110. So, in this case, there are 80 segments. In an embodiment, the angle between dividers 108 can be user defined. In an embodiment, the distance between dividers 110 can be user defined. In an embodiment, a maximum radius (i.e., the outermost divider 110) of the shape context descriptor framework 104 can be defined by a user. In an embodiment, the number of divisions in the shape context descriptor framework (e.g., along the x and/or y axes of a Cartesian grid, or for r and/or θ of a polar coordinate grid) differs to adjust the sensitivity of shape identification and/or shape comparison. In an embodiment, the scale of an axis is a linear scale. In an embodiment, the scale of an axis is logarithmic. Further, in this embodiment, the shape context descriptor framework 104 is depicted graphically to enable better understanding but as will be appreciated the framework need not be graphically represented and can just be seen as a means of data segmentation.

While a shape context descriptor framework can be defined in terms of polar coordinates such as shown in FIG. 3, the shape context descriptor framework can be another type of coordinate system, such as a Cartesian coordinate system. Further, the shape context descriptor framework can be two-dimensional (as shown in FIG. 3) or three-dimensional. Shape context descriptor framework 104 has a SCDF origin 112.

FIG. 3 further shows a shape 102 for analysis with respect to shape context descriptor framework 104. Shape 102 has a plurality of points 114 located in different segments 106 of shape context descriptor framework 104.

So, to generate a shape context descriptor, the origin 112 of the shape context descriptor framework is located at a focus point 116 on the perimeter of the shape 102. The focus point 116 is a point on the shape with respect to which a plurality of shape context descriptors are determined as described further below. In this case, the focus point 116 is located at a vertex of shape 102, but it can instead be positioned along an edge.

A shape context descriptor can then be defined for another point on the perimeter of the shape relative to the focus point 116 (and thus the origin when located at the focus point 112) as information describing the location (e.g., in a segment 106) of that other point within the shape context descriptor framework 104. In an embodiment, the shape context descriptor for a particular point is a combination of radius and angle defined with respect to the origin 112 at the focus point 116. In an embodiment, the radius can be a logarithm of the radius. In an embodiment, the angle is an angular range. Thus, in an embodiment, a radius and angular range can define a particular segment 106.

As an example, a shape context descriptor can be defined between point 118 and focus point 116 and can be a vector 120 describing the location of point 118 (and thus, in an embodiment, describing the segment 106 in which point 118 is located). Another example of a point on the perimeter of the shape is point 122 and a vector 124 can be defined describing the location of point 122.

Shape context descriptors can then be defined, with respect to focus point 116, for a plurality of points on and around the perimeter of the shape. In an embodiment, the plurality of points includes a subset of all of the vertices of the shape. In an embodiment, the plurality of points includes all of the vertices of the shape and one or more other points on the shape. In an embodiment, the plurality of points includes only the vertices of the shape. In an embodiment, for shape 102, the plurality of points includes all of the perimeter points shown in FIG. 3. In an embodiment, the plurality of points is the points represented in a digital layout file to define the shape. In an embodiment, the plurality of points can be user-defined (and if that number is less than the available points for a shape, there can be oversampling of the shape). The number of points can be 10 or more points, 15 or more points, 20 or more points, 50 or more points, 100 or more points, 500 or more points, 1000 or more points, 5000 or more points, or 10,000 or more points. The number of points used can be determined based upon an accuracy measure. For example, the accuracy for a certain number of points can be evaluated and if it meets a threshold of accuracy (e.g., greater than or equal to 0.9 out of 1) then it can be used; otherwise if it insufficient the number of points can be increased. In an embodiment, k points from the total number n of points available for a shape are sampled uniformly around the shape, wherein k is less than or equal to n. In an embodiment, the number of shape context descriptors determined is the same for each feature shape undergoing analysis (including, e.g., if the number of available points is different in which case there would be oversampling). In an embodiment, the number of shape context descriptors determined for different feature shapes can be different. In an embodiment, a shape having a large number of shape context descriptors can be represented in the analysis by a subset of the shape's shape context descriptors.

Figure 4:
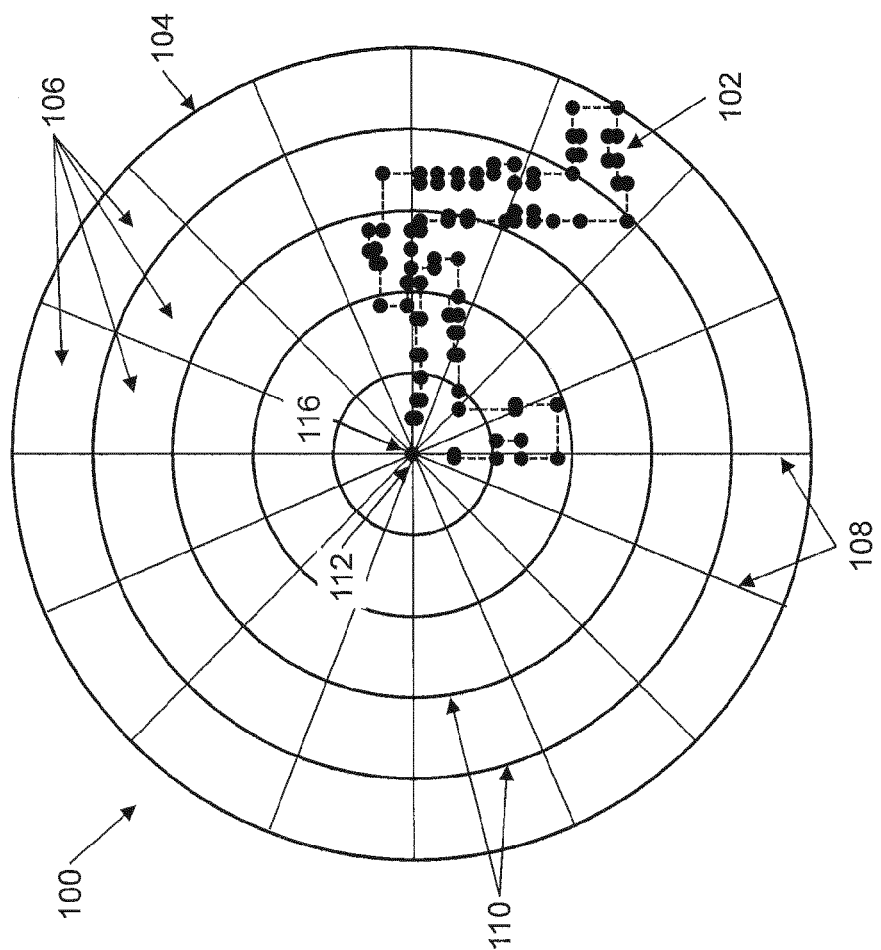
FIG. 4 depicts a construct used to generate a shape context descriptor for shape identification and/or comparison, according to an embodiment.

The focus point 116 can then be shifted to another point on the perimeter of the shape, such as point 118 or point 122. Shape context descriptors can then be determined relative that new focus point 116 for a plurality of other points on the perimeter of the shape. An example of this is depicted in FIG. 4 where the focus point 116 is now located at a different points on the perimeter of the shape. As seen, the origin 112 is also now located at the focus point 116. Using this new focus point 116, a plurality of shape context descriptors relative to other points on and around the perimeter can be obtained in similar fashion as already described.

Thus, in an embodiment, a point (a focus point for reference) on the perimeter on the shape can have a set of one or more shape context descriptors, each shape context descriptor relating to another point on the perimeter of the shape and having the focus point as the origin. In an embodiment, the focus point can have a plurality of shape context descriptors for the focus point and relating to a plurality of such other points around the perimeter of the shape. Further, each of a plurality of points on the perimeter (each being a focus point for reference) on the shape can a set of one or more shape context descriptors, each such shape context descriptor relating to another point on the perimeter of the shape and having the respective focus point as the origin. So, a shape can have a plurality of such sets of shape context descriptors, each set relating to a point of the plurality of points located around the perimeter of the shape.

Further, as will be appreciated, multiple different features with the same or similar shape can be similarly analyzed. In an embodiment, 100 or more, 1000 or more, 100,000 or more, 1,000,000 or more, 10,000,000 or more, 100,000,000 or more or 500,000,000 or more features in an image can be analyzed in a similar manner.

The shape identification described above can capture local feature shape properties that are rotation variant, translation invariant and scale variant (or a subset thereof). That is, a different set of shape descriptor data will be produced for two features with an identical shape but that are rotated or scaled with respect to each. However, a same set of shape descriptor data will be produced for two features with an identical shape but are translated with respect to each other. But, even though the shape descriptor data may be different for rotated and/or scaled features with a same shape, the shape context descriptor data for one of the features may nevertheless enable finding of the other feature with a shape of interest even if that the feature has a rotated version of the shape of interest and/or a scaled version of the shape of interest as described further herein.

However, in some cases, it may be desired that a shape be found irrespective of rotation of the shape of interest. In that case, in an embodiment, the shape context descriptor can be made rotation invariant, i.e., it will capture the shape with any rotation. One way to do this is to determine a center of gravity of the shape and then determine the angle from the center of gravity to the focus point. Then, the shape context descriptor data as described above can be determined except that the angle is modified to subtract therefrom the angle from the center of gravity to the focus point. Similarly, in some cases, it may be desired that a shape be found irrespective of uniform scaling of the shape of interest. In that case, in an embodiment, the shape context descriptor can be made scale invariant, i.e., it will capture the shape with any uniform scale. One way to do this is to allow a maximum radius (i.e., the outermost divider 110) of the shape context descriptor framework 104 to vary and be tied to the maximum cross-wise dimension of the shape.

Analysis of SCDs

Now, the shape context descriptors for a point on the feature shape can be processed to arrive at a vector for further analysis (as will be described further hereafter). In an embodiment, the shape context descriptor vector comprises a count of the number of points at a particular location (e.g., within a segment 106, within an annular band of segments 106, within a radial band of segments 106, etc.) within the shape context descriptor framework 104. In an embodiment, the shape context descriptors can be binned based on, e.g., radius and/or angle, to arrive at the shape context descriptor count vector. For example, referring to FIG. 3, the segment 106 in which point 118 is located can be defined by radius and angle and as seen in FIG. 3, there are two points in that segment. So, a shape context descriptor vector can be defined for focus point 116 that specifies a count of 2 for that segment. Similarly, the segment 106 in which point 122 is located can be defined by radius and angle and as seen in FIG. 3, there is only 1 point in that segment. So, the shape context descriptor vector for focus point 116 can further specify a count of 1 for that segment. So, in an embodiment, a shape context descriptor vector can be created, for a particular focus point on the feature shape, that has the count, per particular location (e.g., segment 106) within the shape context descriptor framework 104, of the shape context descriptors defined with respect to that focus point that terminate in that particular location. In an embodiment, the shape context descriptor vector can be represented as a histogram with the count defined per location. While a single shape context descriptor vector is described herein per focus point on the shape, it could be possible to have a shape context descriptor vector defined per location.

To help explain this further, FIG. 5 portrays an example construct 500 of a shape context descriptor framework 502 and a relatively simple shape 504. Shape context descriptor framework 502 includes a total of 16 segments in two rings having eight radial divisions around SCDF origin 506. The segments of shape context descriptor framework 502 are numbered with numerals ranging from 1 to 16 for convenience here. Instead, the segments could be defined in terms of radius and/or angle. Further, a focus point 508 is depicted with respect to which an example set of shape context descriptors are determined. As will be appreciated, other focus points can be selected on the shape and further sets of shape context descriptors can be derived.

FIG. 6 is a tabular representation 600 of the count of the number of shape context descriptors defined with respect to the focus point 508 for each of the segments in FIG. 5. Table 600 lists, in the first column, the segments by corresponding numeral from FIG. 5. Further, the table provides, in the second column, the count of the number points in each applicable segment for which a shape context descriptor has been defined with respect to focus point 508. For example, as seen in FIG. 5, segment 13 has 3 points for which a shape context descriptor is defined with respect to focus point 508 and segment 12 has 2 points for which a shape context descriptor is defined with respect to focus point 508. So, in an embodiment, a shape context descriptor vector can correspond to the collection of rows and their associated counts.

As discussed above, this analysis can be performed for a plurality of focus points around a particular shape to obtain a plurality of sets of shape context descriptors and then a plurality of shape context descriptors. Moreover, this analysis can applied to a plurality of different features to extract the sets of shape context descriptors and associated shape context descriptor vectors.

Clustering Analysis

Once such sets of shape context descriptors for different features are obtained, in an embodiment, the shape context descriptors are abstracted. This can enable, for a shape comparison process to determine which features have a same or similar shape or to identify those features that are the same as or similar to a reference or target shape and/or for a shape searching process. In an embodiment, abstracting the shape context descriptors for the shape comparison process comprises a multidimensional analysis of the shape context descriptors. In an embodiment, the multidimensional analysis includes clustering of points, which represent shape context descriptors of a shape, in a multidimensional space to arrive a plurality of clusters. In an embodiment, each of the multidimensional space points corresponds to a shape context descriptor vector. In an embodiment, the clusters can then be used to define a shape signature, or shapeme, for a feature. This shape signature can then be used to, e.g., find a same or similar shaped feature among a plurality of features.

So, to enable the multidimensional analysis, in an embodiment, a multidimensional space is used that includes a plurality of mutually perpendicular dimensions (e.g. axes). In an embodiment, each of the dimensions represents a particular location (e.g., segment 106) within the shape context descriptor framework. In an embodiment, the multidimensional space includes a dimension for each particular location (e.g., segment 106) within the shape context descriptor framework. In an embodiment, each of the dimensions represents a set of natural numbers.

In an embodiment, each of the dimensions represents a count of the number of occurrences that a shape context descriptor terminated in the dimension's associated particular location (e.g., segment 106) within the shape context descriptor framework. So, in an embodiment, a point in the multidimensional space is associated with a shape context descriptor vector of a particular feature.

In an embodiment, each multidimensional space point is associated with the shape context descriptor vector that corresponds to a focus point on the shape of a particular feature. In particular, in an embodiment, the multidimensional space point has as its coordinates a plurality of particular locations (e.g., segments 106) within the shape context descriptor framework as provided in the shape context descriptor vector and has coordinate values that correspond to the counts of shape context descriptors terminating in the associated particular locations, e.g., the magnitudes from the shape context descriptor vector. So, in an embodiment, a feature can have many associated points with the multidimensional space, e.g., one for each focus point on the shape feature.

To aid understanding, an example of the data for a particular focus point of a feature shape is shown in FIG. 7. The data here corresponds to the data for the focus point of FIGS. 5 and 6. In this example, the multidimensional space has 16 orthogonal dimensions (e.g., axes). Thus, a point within that multidimensional space would have 16 coordinates and associated values for each coordinate. So, referring to FIG. 7, a multidimensional space point could be defined, in this example, as having a value of 1 for the coordinate corresponding to the dimension associated with segment 6 within the shape context descriptor framework 502, a value of 3 for the coordinate corresponding to the dimension associated with segment 11 within the shape context descriptor framework 502, a value of 1 for the coordinate corresponding to the dimension associated with segment 12 within the shape context descriptor framework 502, a value of 2 for the coordinate corresponding to the dimension associated with segment 13 within the shape context descriptor framework 502, and a value of 0 for all other coordinates. Thus, the multidimensional space point can be defined as (0,0,0,0,0,1,0,0,0,0,3,1,2,0,0,0), wherein the coordinates are in order from left to right the dimensions 1-16 in FIG. 7 (and thus are dimensions corresponding to respectively segments 1-16 in FIG. 6). Similar data would be available for a plurality of focus points along the shape of a particular feature to obtain a plurality of points within the multidimensional space for the feature.

So, in an embodiment, the multidimensional space can be populated with a plurality of points corresponding to a feature. In an embodiment, the multidimensional space can be populated with a plurality of points corresponding to each of a plurality of different features (evaluated with the same shape context descriptor framework) within one or more images. So, while the clustering processes described hereafter will focus on a multidimensional space populated with a plurality of points corresponding to each of a plurality of different features, it could use a multidimensional space populated with a plurality of points corresponding to a single feature.

Figure 8:
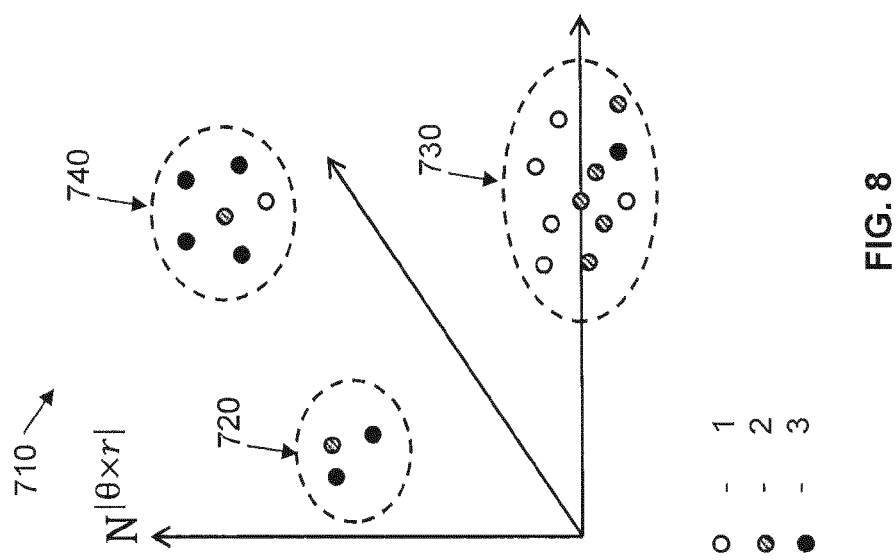
FIG. 8 depicts a multidimensional space representing a plurality of shape context descriptor vectors, according to an embodiment.

A highly schematic example of a multidimensional space 710 populated with a plurality of points corresponding to each of a plurality of features is shown in FIG. 8. Such a graphical representation is not necessary for the analysis of the techniques herein and is merely shown here to help explanation.

Figure 9A:
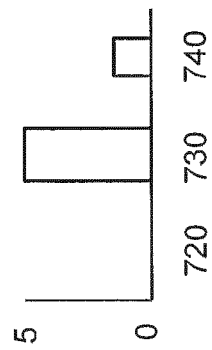
FIG. 9A, FIG. 9B, and FIG. 9C depicts example feature shapes and associated shapeme descriptions represented in histogram form.
Figure 9B:
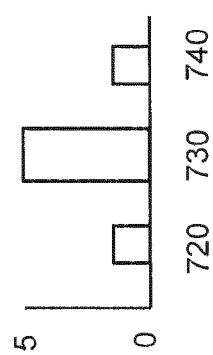
Figure 9C:
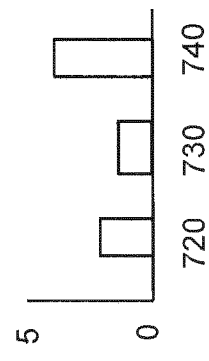

As seen in FIG. 8, a plurality of multidimensional space points is shown, each multidimensional space point corresponding to a different focus point around a respective feature shape and each multidimensional space point of the plurality of multidimensional space points corresponding to one of three features, namely features 1, 2 and 3. A schematic representation of the shapes of features 1, 2 and 3 are shown in FIGS. 9A, 9B and 9C respectively. The dimensions can correspond to, for example, segments 102 within the shape context descriptor framework 104, wherein each segment corresponds to a particular combination of radius r and angle θ.

Now with a multidimensional space populated with a plurality of points corresponding to each of one or more features, the multidimensional analysis can proceed to a clustering analysis of the multidimensional space points to arrive at a plurality of clusters. The clustering can give an indication of the prevalence of certain shape characteristics of a particular shape of a feature and yield a shape fingerprint of the feature. And, by analyzing a plurality of different features within the shape context descriptor framework and considering the multidimensional space points together, dominant shape characteristics shared by the different features can be identified and used to arrive at shape fingerprints for each of the different features. Those shape fingerprints will focus on dominant shared shape characteristics so that shape context descriptor data that doesn't contribute to defining the predominant shape characteristics of the features is minimized.

So, in an embodiment, the clustering involves determining whether shape context descriptor data is near to each other in a multidimensional space. If so, the clustering analysis identifies one or more dominant shape characteristics of those one or more features by designating such lumped together adjacent shape context descriptor data as a cluster. Multiple such clusters can be identified. Furthermore, where multiple different features are analyzed, dominant shape characteristics shared among the different features can be identified by designating lumped together adjacent shape context descriptor data of different features as a cluster.

The clustering analysis can be performed with one or more different clustering algorithms in the art. In an embodiment, the clustering involves calculating the proximity of points, representing shape context descriptors of a shape, in the multidimensional space to arrive a plurality of clusters of multidimensional space points. In an embodiment, a distance (e.g., Euclidian distance) between points in the multidimensional space can be used to identify a degree of similarity between points in the multidimensional space for the purposes of identifying a cluster.

In an embodiment, the clustering is a k-means clustering method. Although k-means clustering is described herein as an exemplary method of identifying similar shape context descriptors, other methods of assigning shape context descriptor data into clusters or groups, including iteratively partitioning shape context descriptor data are envisioned by the present disclosure. For example, a clustering method can be used that finds the number of clusters. In that case, for example, the clustering method can make an assumption about the data to come up with a number of clusters (e.g., to start an iteration scheme such as used in k-means clustering).

In an embodiment, the k-means clustering analysis includes determining a number of clustering centroids in a multidimensional space. A number of initial clustering centroids are added to the multidimensional space (e.g., identified in the multidimensional space data). In an embodiment, the number of initial centroids is 3 or more, 5 or more, 10 or more, 20 or more, 50 or more, or 100 or more. In an embodiment, initial clustering centroids are randomly distributed across the multidimensional space. In an embodiment, initial clustering centroids are distributed uniformly across the multidimensional space.

After initial clustering centroids are added, a distance (e.g., Euclidian distance) between each initial clustering centroid and multidimensional space points is calculated. Based on the calculation of distances between the initial clustering centroids and the multidimensional space points, each multidimensional space point is assigned to its nearby clustering centroid to form an associated cluster with that centroid. Based on this attribution, a new clustering centroid is calculated for that cluster and replaces the previous clustering centroid. The multidimensional space with one or more multidimensional space clusters having a new clustering centroid is an intermediate clustering solution of the clustering process. The distance determination, assignment to a cluster and determining of new centroids is repeated to obtain further intermediate clustering solutions until an exit condition is satisfied. In an embodiment, the exit conditions can be a certain number of iterations. In an embodiment, an exit condition occurs when multidimensional space point assignments to intermediate clustering solutions have stabilized (e.g., after a predetermined number of iterations, a mean change in distance of points to an associate centroid is below a certain amount, etc.). In an embodiment, an exit condition exists when multidimensional space point assignments to one or more clusters remain unchanged (or fewer than a threshold amount of changes occur) for a predetermined number of iterations of intermediate clustering solution calculations. The stable intermediate clustering solution is deemed a final clustering solution and will identify a number of clusters having shape context data. A shape description signature can then be generated based upon the final clustering solution as described hereafter. In an embodiment, when intermediate clustering solutions do not stabilize, a different set of clustering centroids can be applied to the multidimensional space data before repeating the clustering analysis process.

Referring to FIG. 8, an example of a final clustering solution is depicted. In this highly schematic embodiment, three clusters 720, 730 and 740 were identified by, e.g., k-means clustering with, e.g., 3 initial clustering centroids.

With the clusters identified, the clusters can then be used to define a shape signature, or shapeme, for a feature.

In an embodiment, a shapeme of a shape contains information about the distribution of multidimensional space points for the shape among clusters of the final clustering solution for a shape identification and comparison process. In an embodiment, a shapeme for a particular feature is defined as a count of the number of multidimensional space points within each cluster for the particular feature. So, in an embodiment, a shapeme can be generated for a plurality of features, which can have different shapes, to obtain a plurality of shapemes.

To help explain this concept, FIG. 9A, FIG. 9B and FIG. 9C schematically and respectively portray an embodiment of a shapeme definition. In an embodiment, a shapeme can be represented as a histogram having a number of shapeme fields equal to the number of clusters used to generate a final clustering solution during the clustering process and having magnitudes corresponding to the count of multidimensional space points for the feature shape in the respective clusters.

FIG. 9A shows an example feature shape 1 (for which multidimensional space points were defined, and clusters identified, as shown in FIG. 8) and an associated histogram to schematically depict the shapeme definition for feature shape 1. As noted above, the shapeme is a count of multidimensional space points for the feature in each cluster. The histogram in FIG. 9A graphically shows such a shapeme description (or vector) for feature shape 1, where the shapeme description for feature shape 1 has, referring to FIG. 8, a count of zero multidimensional space points in cluster 720, a count of 5 multidimensional space points in cluster 730 and a count of 1 multidimensional space point in cluster 730. So, the shapeme description (or vector) for feature shape 1 can be defined as (0, 5, 1) wherein the coordinates correspond to the clusters.

FIG. 9B shows an example feature shape 2 (for which multidimensional space points were defined, and clusters identified, as shown in FIG. 8) and an associated histogram to schematically depict the shapeme definition for feature shape 2. The histogram in FIG. 9B graphically shows a shapeme description (or vector) for feature shape 2, where the shapeme description for feature shape 2 has, referring to FIG. 8, a count of 1 multidimensional space point in cluster 720, a count of 5 multidimensional space points in cluster 730 and a count of 1 multidimensional space point in cluster 730. So, the shapeme description (or vector) for feature shape 2 can be defined as (1, 5, 1) wherein the coordinates correspond to the clusters.

FIG. 9C shows an example feature shape 3 (for which multidimensional space points were defined, and clusters identified, as shown in FIG. 8) and an associated histogram to schematically depict the shapeme definition for feature shape 3. The histogram in FIG. 9C graphically shows a shapeme description (or vector) for feature shape 3, where the shapeme description for feature shape 3 has, referring to FIG. 8, a count of 2 multidimensional space points in cluster 720, a count of 1 multidimensional space point in cluster 730 and a count of 4 multidimensional space points in cluster 730. So, the shapeme description (or vector) for feature shape 3 can be defined as (2, 1, 4) wherein the coordinates correspond to the clusters.

A shapeme can then be used for various purposes. As an example, a shapeme can be used to find features with a same shape within an image even if the shape has been rotated, scaled or translated. This can be done by encoding a plurality of features into shapemes and then finding features having the same shapeme. Thus, one can then build a search engine on these shapemes. Thus, in an embodiment, there is provided a search engine to find and locate features with a particular shape using the shapeme. Further, this can be extended to find features with the same or similar shapes by finding similar shapemes. A benefit of this approach is that it can deal with large data volumes (e.g., patterns can easily have millions or billions of shapes, and image data archives also can grow in these orders of magnitude) while still resulting in relatively fast query times for particular shapes.

Further, in an embodiment, features can be cross-identified between different sets of data. For example, a feature identified for a patterning device pattern layout (e.g., the digital layout file describing the patterning device pattern layout, a manufactured patterning device embodying the patterning device pattern layout, etc.) can be cross-identified with a same or similar feature in terms of shape created on a substrate using the patterning device pattern layout via the shapeme. As another example, a feature identified for a digital layout file for a patterning device can be cross-identified with a same or similar feature in terms of shape of a manufactured patterning device embodying the pattern described by the digital layout file via the shapeme. So, using shapemes defined with respect to the same shape context descriptor framework, one can query across different types of pattern data. For example, a shape in a digital layout file can be identified given a SEM image shapeme, and vice versa. So, for example, a digital layout file and SEM image can be linked, not only based on coordinates, but also on content, namely same or similar shapes.

Also, in an embodiment, since for a patterned substrate (and optionally for particular applied processing steps) a set of metadata can be provided, the queries can be enriched with this information as well. So, for example, a possible query such as: "All G-type shapes, located on the edge of the substrate, that have W-type shapes on the layer above it" can be made by searching using shapemes.

As another example, an underlying distribution of shape types can automatically be derived for an image by counting the number of features with the same (or similar) shapeme and doing so for each of a plurality of different shapemes. In an embodiment, shapes can then be ranked on how representative they are for the complete pattern design based on their design features. Given a limited number of measurement data (e.g., SEM measurement data), measurement locations can then be optimized to cover as much of the "shape space" as possible. Then given a set of these measurement locations, a representative process window, for example, can be derived.

As another example, the features in the pattern can be labeled by type of shape using the shapeme. This can allow, for example, determination of which shapes are often close to each other, which assist features are often close to which optical proximity corrected features, and/or which shapes are often printed above each other (e.g., for multi-patterning and/or for multiple physical layers).

Identifying Similar Shapes by Hashing

As noted above, the shapeme can be used to identify features with identical shapes. In an embodiment, the shapeme can additionally or alternatively be used to identify features with similar shapes. In an embodiment, the similarity of shapemes can be determined using one or more different similarity techniques. In an embodiment, by a similarity technique, similar shaped features can be relatively quickly found among a plurality of features by using the shapemes obtained for all the features under consideration.

In an embodiment, the similarity is determined by performing a hashing function on a plurality of shapemes in a shapeme matrix. In particular, in an embodiment, a locality sensitive hashing (LSH) is used to identify similar shapes desirably with reduced false positive and false negative results.

Figure 10:
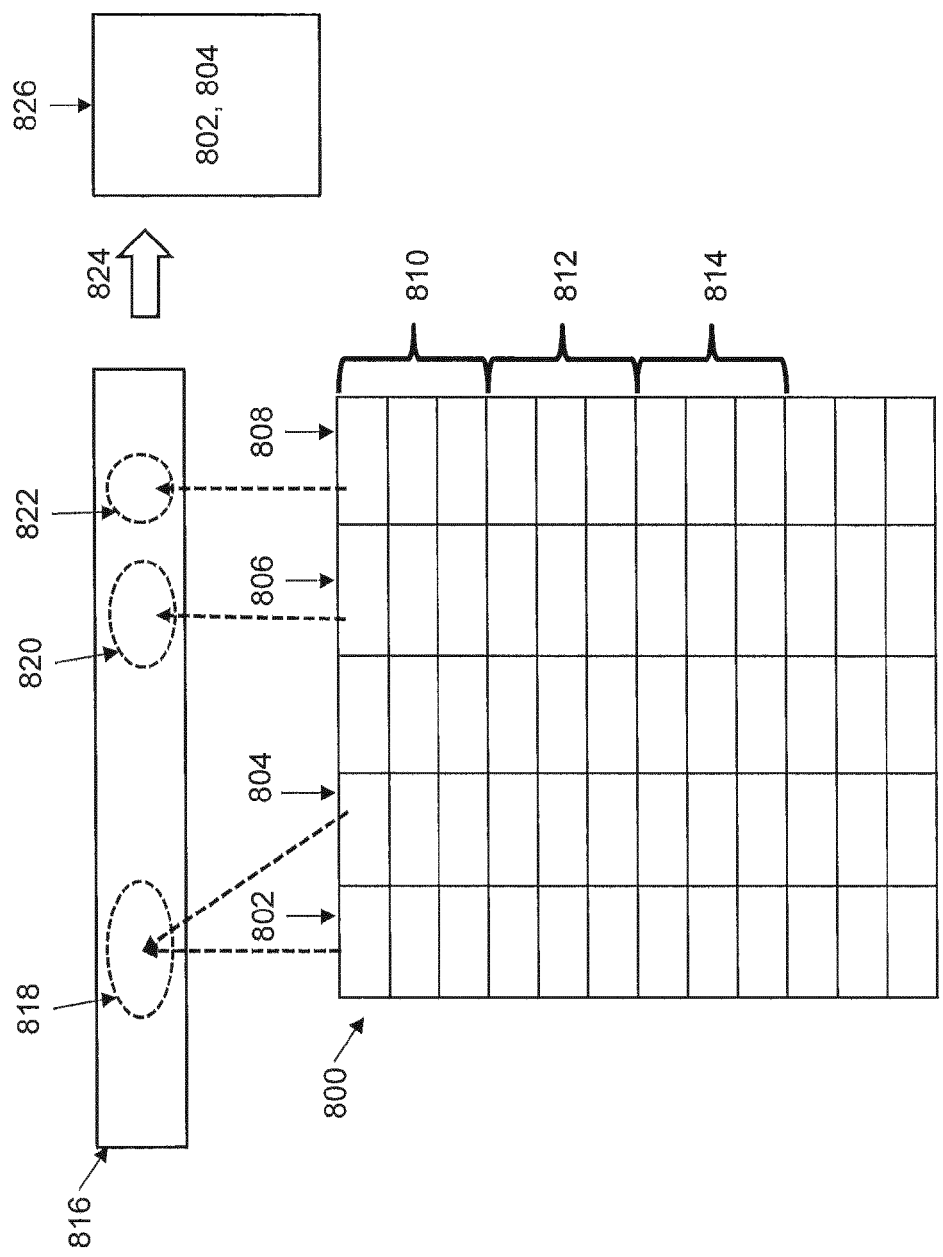
FIG. 10 depicts a schematic matrix for locality sensitive hashing using shapemes, according to an embodiment.

An embodiment of locality sensitivity hashing to identify similar shapemes will be described with respect to FIG. 10. In an embodiment, the locality sensitive hashing involves dividing a set of shapeme data into blocks and determining similar shapeme based on the results of hashing blocks of shapeme data.

Shapeme matrix 800 comprises the shapemes under consideration. In an embodiment, the matrix 800 comprises the plurality of different shapemes under consideration in the columns and the clusters for which the shapemes are defined in the rows. While only 5 columns and 12 rows are shown in this schematic representation, a different number of columns and/or rows can be used.

Further, the matrix is divided into b bands 810, 812, 814 and each band is comprises r rows. In an embodiment, each band 810, 812, 814 has the identical number r of rows. While three bands 810, 812, 814 are identified here, the number of bands can be different. The bands 810, 812, 814 divide the matrix into blocks, each block defined by the associated column and associated band.

A hash function h(x) is applied to each block. That is, the hash is applied per shapeme and for a certain number of clusters for that shapeme defined by the band 810, 812, 814. The result is that each of the blocks is hashed into a bucket as part of the hash results 816. The hashing yields binning of shapemes that are similar into a same bucket since the hashing identifies at least part of one shapeme being identical or highly similar to at least part of another shapeme. So, the shapeme signatures are hashed repeatedly to a number of hash buckets such that t-similar shapemes are likely (p-probable) to land in the same bucket. In an embodiment, the number of buckets is relatively high, e.g., 10 or more buckets, 20 or more buckets, 50 or more buckets, 100 or more buckets, or 500 or more buckets. The hash function h(x) can be any mathematical function or scheme that, when applied to a shapeme or to a portion of a shapeme, results in solutions that indicate when a shapemes is at least part similar to another shapeme. In an embodiment, the output of hash function h(x) is a scalar. In an embodiment, locality sensitive hashing uses random hyperplane projection.

For example, the block defined for shapeme 802 by band 810 can be hashed into bucket 818. Similarly, the block defined for shapeme 804 by band 810 can also be hashed into bucket 818. So, based only on this result, shapeme 802 and shapeme 804 are similar by being binned to the same bucket 818. So, in an embodiment, this matching hash result can be recorded 824 as a shapeme solution set 826 of shapemes 802 and 804.

However, the block defined for shapeme 806 by band 810 can be hashed into bucket 820 different from bucket 818 and the block defined for shapeme 808 by band 810 can be hashed into different bucket 822. So, based only on this result, shapeme 806 and shapeme 808 are not similar by being binned to different buckets 820 and 822.

As will be appreciated, the hashing is repeated for all the shapemes and for all the bands to result in hashing of plurality of blocks of shapeme data. The result is that all the blocks are hashed into respective buckets. Then, shapemes that are binned to a same bucket are identified as being similar with each other for that band. Since the shapemes represents the shape of a particular feature, then the features that correspond to the shapemes that are binned together have similar shapes. So, similarly shaped features can be identified. In an embodiment, shaped features can be designated as similar if their shapemes are binned together in a same bucket for one band. In an embodiment, shaped features can be designated as similar if their shapemes are binned together in a same bucket for a plurality of bands (e.g., all of the bands). In an embodiment, the counts of the instances of shapemes being binned to a same bucket can be used to identify features with highly similar shapes. For example, all the shapemes that are binned more than once, more than twice, more than 10 times, more than 20 times, more than 50 times, etc. to a bucket can be considered the most similar in shape.

The choice of the number b of bands and the number r of rows influences the t-fraction similarity and so it is desired to tune these parameters to reduce or eliminate false positives and false negatives. In an embodiment, the similarity of the shapemes can be defined as $$1-(1-p^r)^b \qquad (1)$$

wherein p is the probability of a shapeme sharing a hash bucket. So, there is a value t for the probability p such that $$1-(1-t^r)^b=t \qquad (2)$$

So, for a user provided value t and a number r of rows defined by the system or user, a value of the number b of bands can be calculated using:

$$b = \left\lceil \frac{\log\frac{1}{\delta}}{-\log(1-t^r)} \right\rceil \qquad (3)$$

where δ is a user defined choice for the particular application and is based on the p probability that has been set since it is desired to have shapes that are t similar with p probability; for example, t-similar with at least (1−δ) probability. So, where δ is a number from 0 to 1, 0 represents most confidence of binning correctly while 1 represents the least confidence of binning correctly. But selecting 0 can lead to many false positives so a balance in δ should be chosen. Similarly, one can derive r based on set values of t and b.

Following performing this LSH, the results 826 yield shapemes that are similar by having been hashed into the same bucket. Thus, in an embodiment, a first plurality of similar shapemes can be identified along with another second plurality of similar shapemes. Since the shapemes represents the shape of a particular feature, then the features that correspond to the shapemes that are binned together have similar shapes. So, similarly shaped features can be identified because, of course, the particular features associated the shapemes are known. The result is that particular similar features in an image can be relatively quickly identified by using the identified similar shapemes.

A benefit of this hash based approach is that it can deal with large data volumes (e.g., patterns can easily have millions or billions of shapes, and image data archives also can grow in these orders of magnitude) while still resulting in relatively fast query times for the same or similar shapes.

Figure 11:
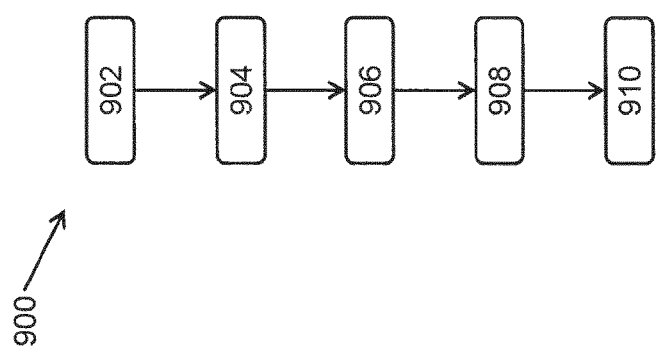
FIG. 11 depicts an example flow chart for locality sensitive hashing using shapemes, according to an embodiment.
Figure 12:
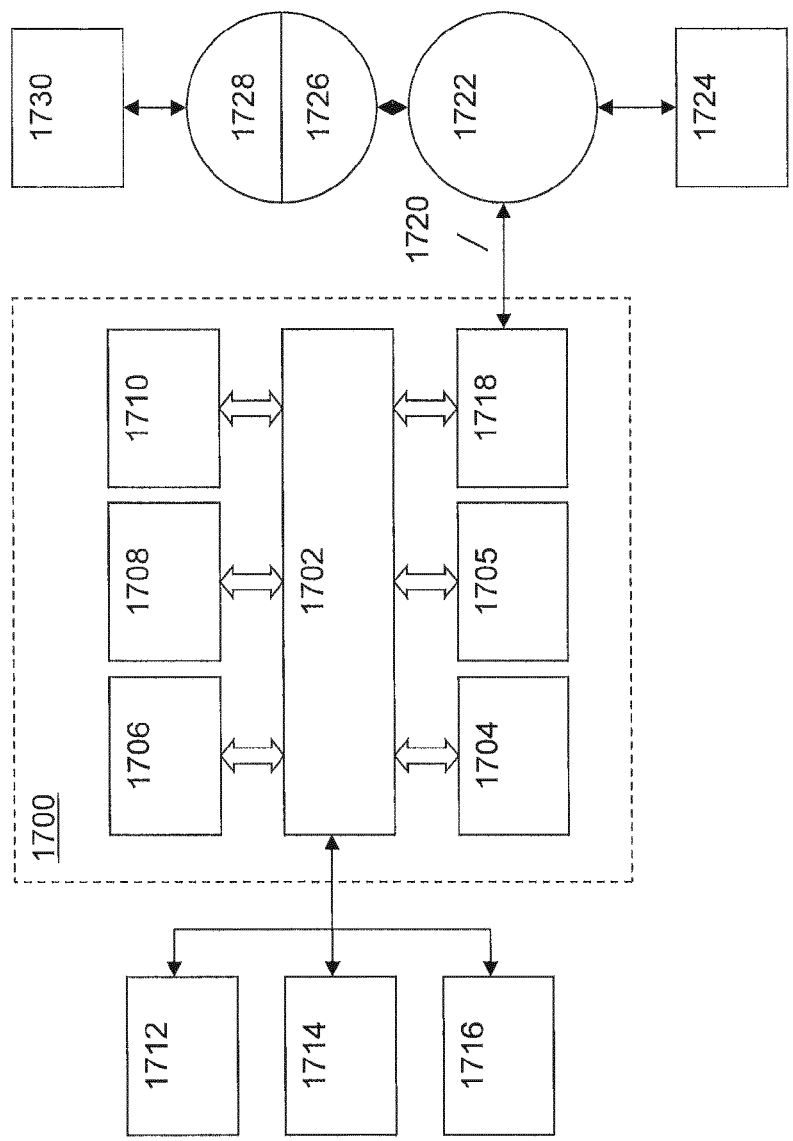
FIG. 12 depicts a block diagram of an example computer system.

FIG. 11 is a flowchart for an example method 900 of performing shape identification and/or comparison operations, according to an embodiment. In this example, a plurality of operations is depicted but not all of the operations need to be performed. Any appropriate combination of operations can be selected from the following operations.

Operation 902 includes a selection of one or more features for analysis (e.g., for determination of shape context descriptor data, for determination of a shapeme, for determination of similar shapes, for searching for, or identifying, features using a shapeme, etc.) according to the methods described herein. In an embodiment, parameters for the shape identification and/or comparison process can be selected. For example, in an embodiment, a type of shape context descriptor framework, e.g., one with annularly arranged blocks defined by polar coordinates. For example, the number of segments of the shape context descriptor framework for use in a shape identification process can be selected, e.g., by specifying the number of divisions of segments, a maximum radius of a polar coordinates arrangement of segments, etc. As a further example, the number b of bands, number r of rows, and/or a t-similarity value can be provided by a user and other values calculated. While these setup steps are described with respect to operation 902, the setup steps can be performed with the associated shape identification and/or comparison steps (e.g., operations 904, 906, etc.).

With a set of shaped features, operation 904 of method 900 includes generating shape context descriptors of one or more shaped features (e.g., all shaped features) in the set of shaped features as described herein. Further, in an embodiment, operation 904 can include generating one or more shape context descriptor vectors as described herein. The shape context descriptor data (e.g., the shape context descriptors, the shape context descriptor vectors or other data derived from those) can then be used for various purposes as described herein, including, e.g., querying a data set (e.g., a digital layout file, e.g., GDS and/or an image, e.g., a SEM image) for one or more features with a target shape, automatically organizing and syncing different data sets (e.g., features represented in a digital layout file, e.g., GDS with features represented in image, e.g., a SEM image), characterizing and/or summarizing a data set with shaped features, etc.

Operation 906 involves steps related to performing a clustering analysis of shape context descriptors for one or more shaped features in a set of shaped features as described herein. For example, the shape context descriptor data of operation 904 can be represented by points in a multidimensional space and then clustering can be used to identify clusters. In an embodiment, the shape context descriptor data of a plurality of different shaped features can be included in the multidimensional space and clustered. In an embodiment, a shape signature, or shapeme, can be defined for a shaped feature based on the clustering results. In an embodiment, the shapeme for a feature corresponds to a count of the shape context descriptor data in each cluster for the particular feature as described herein. In an embodiment, a shapeme is obtained for each of a plurality of different shaped features. The results of the clustering (e.g., the one or more shapemes) can then be used for various purposes as described herein, including, e.g., querying a data set (e.g., a digital layout file, e.g., GDS and/or an image, e.g., a SEM image) for one or more features with a target shape, automatically organizing and syncing different data sets (e.g., features represented in a digital layout file, e.g., GDS with features represented in image, e.g., a SEM image), characterizing and/or summarizing a data set with shaped features, etc.

In operation 908, similarity of shapes in the set of shapes is determined. For example, shapemes can be assembled into a shapeme matrix and processed with a hashing function to similar shapemes and thus features with similar shapes as described herein. So, a plurality of sets of similarly shaped features can be identified out of a set of shaped features.

In operation 910, the results of any of operations 904-908 can be used for any of various purposes as described herein. For example, any of operations 904-908 can enable a user to search for a particular shape of feature and identify all the instances. This result can then be used in designing, controlling, etc. an aspect of a patterning process (e.g., changing a patterning device pattern, tuning a setting of patterning process apparatus, designing or modifying an inspection process, etc.). The results of any operations can be used to generate electronic instructions for use in configuring (e.g., design, control, etc.) of a patterning process. In an embodiment, any of the data (e.g., shape context descriptor, shape context descriptor framework, shape context descriptor vector, shapeme, etc.) can be represented as a data structure in computer-readable medium, computer system, etc.

In an embodiment, there is provided a method comprising: selecting a shaped feature from a set of shaped features, each shaped feature of the set of shaped features having a set of points on a perimeter of the shape of the shaped feature; creating, by a hardware computer, a plurality of shape context descriptors for the selected shaped feature, wherein each shape context descriptor provides an indication of a location in a shape context descriptor framework of a first focus point of the set of points in relation to a second point of the set of points; and identifying, by the hardware computer, a shaped feature from the set of shaped features having a same or similar shape as the selected shaped feature based on data from the plurality of shape context descriptors.

In an embodiment, the data from the plurality of shape context descriptors comprises a shape context descriptor vector describing a count, for each of a plurality of different locations in the shape context descriptor framework, of the number of shape context descriptors indicating the respective location. In an embodiment, the plurality of shape context descriptors comprises a plurality of sets of shape context descriptors, each set of shape context descriptors comprising shape context descriptors for one particular focus point in the set of points in relation to a plurality of other points in the set of points. In an embodiment, the method comprises creating a plurality of shape context descriptors for each of the shaped features of the set of shaped features. In an embodiment, the data from the plurality of shape context descriptors comprises a shape signature abstracted from the shape context descriptors. In an embodiment, the method further comprises generating a shape signature based on clustering of data from the plurality of shape context descriptors. In an embodiment, the clustering comprises clustering of points within a multidimensional space with dimensions corresponding to different locations within the shape context descriptor framework and the multidimensional space points have magnitudes corresponding to the counts of the number of shape context descriptors indicating the particular different locations. In an embodiment, the clustering comprising identifying clusters by a form of k-means clustering. In an embodiment, the data from the plurality of shape context descriptors comprises shape context descriptor data from a plurality of different shaped features. In an embodiment, the shape signature comprises a count of instances of shape context descriptor data in each cluster. In an embodiment, the method further comprises using the shape signature to identify other features from the set of shaped features. In an embodiment, the method further comprises determining similar shapes among the set of features based on data from the plurality of shape context descriptors. In an embodiment, determining similar shapes comprises using a hashing function to bin similar shapes into a same category. In an embodiment, the hashing function is applied to a shape signature for each features of the set of features. In an embodiment, the shape signatures are derived from a clustering of shape context descriptor information. In an embodiment, determining similar shapes comprise using a form of locality sensitive hashing. In an embodiment, the set of shaped features includes features described in at least two different formats. In an embodiment, a first format is an image of a substrate or patterning device and a second format is a digital layout file for a patterning device. In an embodiment, the method comprises using a shape identified for one format of the at least two formats to identify a shape in another format of the at least two format. In an embodiment, the spatial context descriptors are created to be shape orientation invariant. In an embodiment, the locations comprise spatial area segments within the shape context descriptor framework. In an embodiment, the spatial area segments are defined in a polar coordinate system. In an embodiment, the focus point is located at an origin of a coordinate system of the shape context descriptor framework. In an embodiment, the method further comprises determining a distribution of shapes within the set of shaped features to rank them in terms of prevalence. In an embodiment, the method further comprises guiding selection of measured data using the rank.

As will be appreciated by one of ordinary skill in the art, one or more embodiments described herein may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

FIG. 11 shows a block diagram that illustrates an embodiment of an example computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory RAM or other dynamic storage device, coupled to bus 1702 for storing information and instructions to be executed by processor 1704. Main memory 1806 also may be used for storing temporary variables or other intermediate information during execution of instructions to be executed by processor 1704. Computer system 1700 further includes a read only memory ROM 1708 or other static storage device coupled to bus 1702 for storing static information and instructions for processor 1704. A storage device 1710, such as a magnetic disk or optical disk, is provided and coupled to bus 1702 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network ISDN card or a modem to provide a data communication connection to a corresponding type of telephone line. As another example, communication interface 1718 may be a local area network LAN card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider ISP 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

The embodiments may further be described using the following clauses:

1. A method comprising:
   selecting a shaped feature from a set of shaped features, each shaped feature of the set of shaped features having a set of points on a perimeter of the shape of the shaped feature;
   creating, by a hardware computer, a plurality of shape context descriptors for the selected shaped feature, wherein each shape context descriptor provides an indication of a location in a shape context descriptor framework of a first focus point of the set of points in relation to a second point of the set of points; and
   identifying, by the hardware computer, a shaped feature from the set of shaped features having a same or similar shape as the selected shaped feature based on data from the plurality of shape context descriptors.
2. The method of clause 1, wherein the data from the plurality of shape context descriptors comprises a shape context descriptor vector describing a count, for each of a plurality of different locations in the shape context descriptor framework, of the number of shape context descriptors indicating the respective location.
3. The method of clause 1 or clause 2, wherein the plurality of shape context descriptors comprises a plurality of sets of shape context descriptors, each set of shape context descriptors comprising shape context descriptors for one particular focus point in the set of points in relation to a plurality of other points in the set of points.
4. The method of any of clauses 1 to 3, comprising creating a plurality of shape context descriptors for each of the shaped features of the set of shaped features.
5. The method of any of clauses 1 to 4, wherein the data from the plurality of shape context descriptors comprises a shape signature abstracted from the shape context descriptors.
6. The method of clause 5, further comprising generating a shape signature based on clustering of data from the plurality of shape context descriptors.
7. The method of clause 6, wherein the clustering comprises clustering of points within a multidimensional space with dimensions corresponding to different locations within the shape context descriptor framework and the multidimensional space points have magnitudes corresponding to the counts of the number of shape context descriptors indicating the particular different locations.
8. The method of clause 6 or clause 7, wherein the clustering comprising identifying clusters by a form of k-means clustering.
9. The method of any of clauses 6 to 8, wherein the data from the plurality of shape context descriptors comprises shape context descriptor data from a plurality of different shaped features.
10. The method of any of clauses 6 to 9, wherein the shape signature comprises a count of instances of shape context descriptor data in each cluster.
11. The method of any of clauses 6 to 10, further comprising using the shape signature to identify other features from the set of shaped features.
12. The method of any of clauses 1 to 11, further comprising determining similar shapes among the set of features based on data from the plurality of shape context descriptors.
13. The method of clause 12, wherein determining similar shapes comprises using a hashing function to bin similar shapes into a same category.
14. The method of clause 13, wherein the hashing function is applied to a shape signature for each features of the set of features.
15. The method of clause 14, wherein the shape signatures are derived from a clustering of shape context descriptor information.
16. The method of any of clauses 12 to 15, wherein determining similar shapes comprise using a form of locality sensitive hashing.
17. The method of any of clauses 1 to 16, wherein the set of shaped features includes features described in at least two different formats.
18. The method of clause 17, wherein a first format is an image of a substrate or patterning device and a second format is a digital layout file for a patterning device.
19. The method of clause 17 or clause 18, comprising using a shape identified for one format of the at least two formats to identify a shape in another format of the at least two format.
20. The method of any of clauses 1 to 19, wherein the spatial context descriptors are created to be shape orientation invariant.
21. The method of any of clauses 1 to 20, wherein the locations comprise spatial area segments within the shape context descriptor framework.
22. The method of clause 21, wherein the spatial area segments are defined in a polar coordinate system.
23. The method of any of clauses 1 to 22, wherein the focus point is located at an origin of a coordinate system of the shape context descriptor framework.
24. The method of any of clauses 1 to 23, further comprising determining a distribution of shapes within the set of shaped features to rank them in terms of prevalence.
25. The method of clause 24, further comprising guiding selection of measured data using the rank.
26. A computer program product comprising a computer readable medium having instructions recorded thereon, the instructions when executed by a computer implementing the method of any of clauses 1 to 25.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle"/"mask", "wafer" or "die" in this text should be considered as interchangeable with the more general terms "patterning device", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

While the concepts disclosed herein may be used with systems and methods for imaging on a substrate such as a silicon wafer, it shall be understood that the disclosed concepts may be used with any type of patterning process and associated manufacturing equipment, e.g., those used for producing patterns on substrates other than silicon wafers and/or those producing patterns without using imaging.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The description of the present application has been presented for purposes of illustration and description, and is not intended to be exhaustive or limiting of the invention in the form disclosed. Many modifications and variations will be apparent to those of ordinary skill in the art. Thus, it will be apparent to one skilled in the art that modifications may be made as described without departing from the scope of the claims set out below.

What is claimed is:

1. A method comprising:
    selecting a shaped feature from a set of shaped features, each shaped feature of the set of shaped features having a set of points on a perimeter of the shape of the shaped feature and the set of shaped features being from a layout for imaging onto a substrate having a radiation-sensitive layer by a lithographic process and/or being from an image taken from the substrate processed by the lithographic process;
    creating, by a hardware computer, a plurality of shape context descriptors for the selected shaped feature, wherein each shape context descriptor provides an indication of a location in a shape context descriptor framework of a first focus point of the set of points in relation to a second point of the set of points; and
    identifying, by the hardware computer, a shaped feature from the set of shaped features having a same or similar shape as the selected shaped feature based on data from the plurality of shape context descriptors.

2. The method of claim 1, wherein the data from the plurality of shape context descriptors comprises a shape context descriptor vector describing a count, for each of a plurality of different locations in the shape context descriptor framework, of the number of shape context descriptors indicating the respective location.

3. The method of claim 1, wherein the plurality of shape context descriptors comprises a plurality of sets of shape context descriptors, each set of shape context descriptors comprising shape context descriptors for one particular focus point in the set of points in relation to a plurality of other points in the set of points.

4. The method of claim 1, further comprising creating a plurality of shape context descriptors for each of the shaped features of the set of shaped features.

5. The method of claim 1, wherein the data from the plurality of shape context descriptors comprises a shape signature abstracted from the shape context descriptors.

6. The method of claim 5, further comprising generating a shape signature based on clustering of data from the plurality of shape context descriptors.

7. The method of claim 6, wherein the clustering comprises clustering of points within a multidimensional space with dimensions corresponding to different locations within the shape context descriptor framework and the multidimensional space points have magnitudes corresponding to the counts of the number of shape context descriptors indicating the particular different locations, and/or wherein the clustering comprising identifying clusters by a form of k-means clustering.

8. The method of claim 1, wherein the data from the plurality of shape context descriptors comprises shape context descriptor data from a plurality of differently shaped features.

9. The method of claim 6, further comprising using the shape signature to identify other features from the set of shaped features.

10. The method of claim 1, further comprising determining similar shapes among the set of shaped features based on data from the plurality of shape context descriptors.

11. The method of claim 10, wherein determining similar shapes comprises using a hashing function to bin similar shapes into a same category.

12. The method of claim 11, wherein the hashing function is applied to a shape signature for each shaped feature of the set of shaped features.

13. The method of claim 1, wherein the set of shaped features includes shaped features described in at least two different formats.

14. The method of claim 1, wherein the spatial context descriptors are created to be shape orientation invariant.

15. A computer program product comprising a non-transitory computer-readable medium having instructions therein, the instructions, upon execution by a computer system, configured to cause the computer system to at least:
    select a shaped feature from a set of shaped features, each shaped feature of the set of shaped features having a set of points on a perimeter of the shape of the shaped feature and the set of shaped features being from a layout for imaging onto a substrate having a radiation-sensitive layer by a lithographic process and/or being from an image taken from the substrate processed by the lithographic process;
    create a plurality of shape context descriptors for the selected shaped feature, wherein each shape context descriptor provides an indication of a location in a shape context descriptor framework of a first focus point of the set of points in relation to a second point of the set of points; and
    identify a shaped feature from the set of shaped features having a same or similar shape as the selected shaped feature based on data from the plurality of shape context descriptors.

16. The computer program product of claim 15, wherein the data from the plurality of shape context descriptors comprises a shape context descriptor vector describing a count, for each of a plurality of different locations in the shape context descriptor framework, of the number of shape context descriptors indicating the respective location.

17. The computer program product of claim 15, wherein the plurality of shape context descriptors comprises a plurality of sets of shape context descriptors, each set of shape context descriptors comprising shape context descriptors for one particular focus point in the set of points in relation to a plurality of other points in the set of points.

18. The computer program product of claim 15, wherein the data from the plurality of shape context descriptors comprises a shape signature abstracted from the shape context descriptors.

19. The computer program product of claim 18, wherein the instructions are further configured to cause the computer system to generate a shape signature based on clustering of data from the plurality of shape context descriptors.

20. The computer program product of claim 15, wherein the instructions are further configured to cause the computer system to determine similar shapes among the set of shaped features based on data from the plurality of shape context descriptors.

* * * * *